(12) United States Patent
Melanson

(10) Patent No.: US 7,554,473 B2
(45) Date of Patent: Jun. 30, 2009

(54) CONTROL SYSTEM USING A NONLINEAR DELTA-SIGMA MODULATOR WITH NONLINEAR PROCESS MODELING

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/865,032

(22) Filed: Sep. 30, 2007

(65) Prior Publication Data

US 2008/0272945 A1    Nov. 6, 2008

Related U.S. Application Data

(60) Provisional application No. 60/915,547, filed on May 2, 2007.

(51) Int. Cl.
*H03M 3/00*    (2006.01)
(52) U.S. Cl. ........................ 341/143; 341/155
(58) Field of Classification Search ................ 341/143, 341/138, 144, 155
See application file for complete search history.

(56) References Cited

U.S. PATENT DOCUMENTS

| | | | |
|---|---|---|---|
| 4,414,493 | A | 11/1983 | Henrich |
| 4,677,366 | A | 6/1987 | Wilkinson et al. |
| 4,797,633 | A | 1/1989 | Humphrey |
| 4,940,929 | A | 7/1990 | Williams |
| 4,973,919 | A | 11/1990 | Allfather |
| 5,278,490 | A | 1/1994 | Smedley |
| 5,323,157 | A | 6/1994 | Ledzius et al. |
| 5,565,761 | A | 10/1996 | Hwang |
| 5,747,977 | A | 5/1998 | Hwang |
| 5,815,102 | A | 9/1998 | Melanson |

(Continued)

FOREIGN PATENT DOCUMENTS

EP    1014563    6/2000

(Continued)

OTHER PUBLICATIONS

Infineon, CCM-PFC Standalone Power Factor Correction (PFC) Controller in Continuous Conduction Mode (CCM), Version 2.1, Feb. 6, 2007.

(Continued)

*Primary Examiner*—Jean B Jeanglaude
(74) *Attorney, Agent, or Firm*—Hamilton & Terrile, LLP; Kent B. Chambers

(57) ABSTRACT

A control system includes a nonlinear delta-sigma modulator, and the nonlinear delta-sigma modulator includes a nonlinear process model that models a nonlinear process in a signal processing system, such as a nonlinear plant. The nonlinear delta-sigma modulator includes a feedback model that models the nonlinear process being controlled and facilitates spectral shaping to shift noise out of a baseband in a spectral domain of a response signal of the nonlinear process. In at least one embodiment, the nonlinear delta-sigma modulator is part of a control system that controls power factor correction and output voltage of a switching power converter. The control system controls the pulse width and period of a control signal to control power factor correction and the output voltage level. In at least one embodiment, the nonlinear delta-sigma modulator generates a signal to control the pulse width of the control signal.

25 Claims, 10 Drawing Sheets

U.S. PATENT DOCUMENTS

| | | | |
|---|---|---|---|
| 5,963,086 | A | 10/1999 | Hall |
| 6,016,038 | A | 1/2000 | Mueller et al. |
| 6,072,969 | A | 6/2000 | Yokomori et al. |
| 6,083,276 | A | 7/2000 | Davidson et al. |
| 6,084,450 | A | 7/2000 | Smith et al. |
| 6,150,774 | A | 11/2000 | Mueller et al. |
| 6,150,969 | A | 11/2000 | Melanson |
| 6,211,626 | B1 | 4/2001 | Lys et al. |
| 6,211,627 | B1 | 4/2001 | Callahan |
| 6,246,183 | B1 | 6/2001 | Buonavita |
| 6,304,473 | B1 | 10/2001 | Telefus et al. |
| 6,344,811 | B1 | 2/2002 | Melanson |
| 6,509,913 | B2 | 1/2003 | Martin, Jr. et al. |
| 6,583,550 | B2 | 6/2003 | Iwasa et al. |
| 6,636,003 | B2 | 10/2003 | Rahm et al. |
| 6,713,974 | B2 | 3/2004 | Patchornik et al. |
| 6,727,832 | B1 * | 4/2004 | Melanson ............ 341/143 |
| 6,741,123 | B1 | 5/2004 | Anderson et al. |
| 6,781,351 | B2 | 8/2004 | Mednik et al. |
| 6,788,011 | B2 | 9/2004 | Mueller et al. |
| 6,806,659 | B1 | 10/2004 | Mueller et al. |
| 6,860,628 | B2 | 3/2005 | Robertson et al. |
| 6,870,325 | B2 | 3/2005 | Bushell et al. |
| 6,882,552 | B2 | 4/2005 | Telefus et al. |
| 6,888,322 | B2 | 5/2005 | Dowling et al. |
| 6,940,733 | B2 | 9/2005 | Schie et al. |
| 6,944,034 | B1 | 9/2005 | Shytenberg et al. |
| 6,956,750 | B1 | 10/2005 | Eason et al. |
| 6,967,448 | B2 | 11/2005 | Morgan et al. |
| 6,975,079 | B2 | 12/2005 | Lys et al. |
| 7,064,498 | B2 | 6/2006 | Dowling et al. |
| 7,088,059 | B2 | 8/2006 | McKinney et al. |
| 7,102,902 | B1 | 9/2006 | Brown et al. |
| 7,109,791 | B1 | 9/2006 | Epperson et al. |
| 7,135,824 | B2 | 11/2006 | Lys et al. |
| 7,161,816 | B2 | 1/2007 | Shytenberg et al. |
| 7,221,130 | B2 | 5/2007 | Ribeiro et al. |
| 7,255,457 | B2 | 8/2007 | Ducharm et al. |
| 7,266,001 | B1 | 9/2007 | Notohamiprodjo et al. |
| 7,292,013 | B1 | 11/2007 | Chen et al. |
| 2004/0227571 | A1 | 11/2004 | Kuribayashi |
| 2004/0228116 | A1 | 11/2004 | Miller et al. |
| 2005/0156770 | A1 | 7/2005 | Melanson |
| 2005/0275354 | A1 | 12/2005 | Hausman, Jr. et al. |
| 2006/0022916 | A1 | 2/2006 | Aiello |
| 2006/0023002 | A1 | 2/2006 | Hara et al. |
| 2006/0226795 | A1 | 10/2006 | Walter et al. |
| 2006/0261754 | A1 | 11/2006 | Lee |
| 2007/0029946 | A1 | 2/2007 | Yu et al. |
| 2007/0040512 | A1 | 2/2007 | Jungwirth et al. |
| 2007/0053182 | A1 | 3/2007 | Robertson |
| 2007/0182699 | A1 | 8/2007 | Ha et al. |

FOREIGN PATENT DOCUMENTS

| | | |
|---|---|---|
| WO | 0227944 | 4/2002 |
| WO | WO2006/135584 | 12/2006 |

OTHER PUBLICATIONS

International Rectifier, IRAC1150-300W Demo Board, User's Guide, Rev. 3.0, Aug. 2, 2005.
International Rectifier, Application Note AN-1077, PFC Converter Design with IR1150 One Cycle Control IC, rev. 2.3, Jun. 2005.
International Rectifier, Data Sheet PD60230 revC, Feb. 5, 2007.
Lu et al., International Rectifier, Bridgeless PFC Implementation Using One Cycle Control Technique, 2005.
Linear Technology, LT1248, Power Factor Controller, Apr. 20, 2007.
ON Semiconductor, AND8123/D, Power Factor Correction Stages Operating in Critical Conduction Mode, Sep. 2003.
ON Semiconductor, MC33260, GreenLine Compact Power Factor Controller: Innovative Circuit for Cost Effective Solutions, Sep. 2005.
ON Semiconductor, NCP1605, Enhanced, High Voltage and Efficient Standby Mode, Power Factor Controller, Feb. 2007.
ON Semiconductor, NCP1606, Cost Effective Power Factor Controller, Mar. 2007.
ON Semiconductor, NCP1654, Product Review, Power Factor Controller for Compact and Robust, Continuous Conduction Mode Pre-Converters, Mar. 2007.
Philips, Application Note, 90W Resonant SMPS with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller, IC, Jan. 6, 2006.
Renesas Technology Releases Industry's First Critical-Conduction-Mode Power Factor Correction Control IC Implementing Interleaved Operation, Dec. 18, 2006.
Renesas, Application Note R2A20111 EVB, PFC Control IC R2A20111 Evaluation Board, Feb. 2007.
STMicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
Unitrode, High Power-Factor Preregulator, Oct. 1994.
Texas Instruments, Transition Mode PFC Controller, SLUS515D, Jul. 2005.
Unitrode Products from Texas Instruments, Programmable Output Power Factor Preregulator, Dec. 2004.
Unitrode Products from Texas Instruments, High Performance Power Factor Regulator, Oct. 2005.
Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J.A. Vilela Jr. et al., An Electronic Ballast with High Power Factor and Low Voltage Stress, IEEE Transactions on Industry Applications, vol. 41, No. 4, Jul./Aug. 2005.
S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEE Transactions on Power Electronics, vol. 8, No. 4, Oct. 1993.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. Cheng et al., A Novel Single-Stage High-Power-Factor Electronic Ballast with Symmetrical Topology, IEEE Transactions on Power Electronics, vol. 50, No. 4, Aug. 2003.

J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.
Q. Li et al., An Analysis of the ZVS Two-Inductor Boost Converter under Variable Frequency Operation, IEEE Transactions on Power Electronics, vol. 22, No. 1, Jan. 2007.
H. Peng et al., Modeling of Quantization Effects in Digitally Controlled DC-DC Converters, IEEE Transactions on Power Electronics, vol. 22, No. 1, Jan. 2007.
G. Yao et al., Soft Switching Circuit for Interleaved Boost Converters, IEEE Transactions on Power Electronics, vol. 22, No. 1, Jan. 2007.
C. M. De Oliviera Stein et al., A ZCT Auxiliary Communication Ciruit for Interleaved Boost Converters Operating in Critical Conduction Mode, IEEE Transactions on Power Electronics, vol. 17, No. 6, Nov. 2002.
W. Zhang et al., A New Duty Cycle Control Strategy for Power Factor Correction and FPGA Implementation, IEEE Transactions on Power Electronics, vol. 21, No. 6, Nov. 2006.
H. Wu et al., Single Phase Three-Level Power Factor Correction Circuit with Passive Lossless Snubber, IEEE Transactions on Power Electronics, vol. 17, No. 2, Mar. 2006.
O. Garcia et al., High Efficiency PFC Converter to Meet EN61000-3-2 AND A14, Proceedings of the 2002 IEEE International Symposium on Industrial Electronics, vol. 3, 2002.
P. Lee et al., Steady-State Analysis of an Interleaved Boost Converter with Coupled Inductors, IEEE Transactions on Industrial Electronics, vol. 47, No. 4, Aug. 2000.
D.K.W. Cheng et al., A New Improved Boost Converter with Ripple Free Input Current Using Coupled Inductors, Power Electronics and Variable Speed Drives, Sep. 21-23, 1998.
B.A. Miwa et al., High Efficiency Power Factor Correction Using Interleaved Techniques, Applied Power Electronics Conference and Exposition, Seventh Annual Conference Proceedings, Feb. 23-27, 1992.
Z. Lai et al., A Family of Power-Factor-Correction Controllers, Twelfth Annual Applied Power Electronics Conference and Exposition, vol. 1, Feb. 23-27, 1997.
L. Balogh et al., Power-Factor Correction with Interleaved Boost Converters in Continuous-Inductor-Current Mode, Eighth Annual Power Electronics Conference and Exposition, 1993. APEC '93. Conference Proceedings, Mar. 7-11, 1993.
Fairchild Semiconductor, Application Note 42030, Theory and Application of the ML4821 Average Current Mode PFC Controller, Oct. 25, 2000.
Unitrode Products from Texas Instruments, BiCMOS Power Factor Preregulator, Feb. 2006.
D. Hausman, Lutron, RTISS-TE Operation, Real-Time Illumination Stability Systems for Trailing-Edge (Reverse Phase Control) Dimmers, v. 1.0 Dec. 2004.
International Rectifier, Data Sheet No. PD60230 revC, IR1150(S)(PbF), uPFC One Cycle Control PFC IC Feb. 5, 2007.
Texas Instruments, Application Report SLUA308, UCC 3817 Current Sense Transformer Evaluation, Feb. 2004.
Texas Instruments, Application Report SPRA902A, Average Current Mode Controlled Power Factor Correctiom Converter using TMS320LF2407A, Jul. 2005.
Unitrode, Design Note DN-39E, Optimizing Performance in UC3854 Power Factor Correction Applications, Nov. 1994.
Fairchild Semiconductor, Application Note 42030, Theory and Application of the ML4821 Average Current Mode PFC Controller, Aug. 1997.
Fairchild Semiconductor, Application Note AN4121, Design of Power Factor Correction Circuit Using FAN7527B, Rev. 1.0.1, May 30, 2002.
Fairchild Semiconductor, Application Note 6004, 500W Power-Factor-Corrected (PFC) Converter Design with FAN4810, Rev. 1.0.1, Oct. 31, 2003.
Fairchild Semiconductor, FAN4822, ZVA Average Current PFC Controller, Rev. 1.0.1 Aug. 10, 2001.
Fairchild Semiconductor, ML4821, Power Factor Controller, Rev. 1.0.2, Jun. 19, 2001.
Fairchild Semiconductor, ML4812, Power Factor Controller, Rev. 1.0.4, May 31, 2001.
Linear Technology, 100 Watt LED Driver, undated.
Fairchild Semiconductor, FAN7544, Simple Ballast Controller, Rev. 1.0.0.
Fairchild Semiconductor, FAN7532, Ballast Controller, Rev. 1.0.2.
Fairchild Semiconductor, FAN7711, Ballast Control IC, Rev. 1.0.2.
Fairchild Semiconductor, KA7541, Simple Ballast Controller, Rev. 1.0.3.
ST Microelectronics, L6574, CFL/TL Ballast Driver Preheat and Dimming, Sep. 2003.
ST Microelectronics, AN993, Application Note, Electronic Ballast with PFC Using L6574 and L6561, May 2004.
International Search Report and Written Opinion for PCT/US2008/062384 dated Jan. 14, 2008.
S. Dunlap et al., Design of Delta-Sigma Modulated Switching Power Supply, Circuits & Systems, Proceedings of the 1998 IEEE International Symposium, 1998.
Freescale Semiconductor, Inc., Dimmable Light Ballast with Power Factor Correction, Design Reference Manual, DRM067, Rev. 1, Dec. 2005.
J. Zhou et al., Novel Sampling Algorithm for DSP Controlled 2 kW PFC Converter, IEEE Transactions on Power Electronics, vol. 16, No. 2, Mar. 2001.
A. Prodic, Compensator Design and Stability Assessment for Fast Voltage Loops of Power Factor Correction Rectifiers, IEEE Transctions on Power Electronics, vol. 22, No. 5, Sep. 2007.
M. Brkovic et al., "Automatic Current Shaper with Fast Output Regulation and Soft-Switching," S.15.C Power Converters, Telecommunications Energy Conference, 1993.
Dallas Semiconductor, Maxim, "Charge-Pump and Step-Up DC-DC Converter Solutions for Powering White LEDs in Series or Parallel Connections," Apr. 23, 2002.
Freescale Semiconductor, AN3052, Implementing PFC Average Current Mode Control Using the MC9S12E128, Nov. 2005.
D. Maksimovic et al., "Switching Converters with Wide DC Conversion Range," Institute of Electrical and Electronic Engineer's (IEEE) Transactions on Power Electronics, Jan. 1991.
V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.
S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.
K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.
K. Leung et al., "Dynamic Hysteresis Band Control of the Buck Converter with Fast Transient Response," IEEE Transactions on Circuits and Systems—II: Express Briefs, vol. 52, No. 7, Jul. 2005.
Y. Ohno, Spectral Design Considerations for White LED Color Rendering, Final Manuscript, Optical Engineering, vol. 44, 111302 (2005).
S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.
J. Turchi, Four Key Steps to Design a Continuous Conduction Mode PFC Stage Using the NCP1653, ON Semiconductor, Publication Order No. AND184/D, Nov. 2004.
Megaman, D or S Dimming ESL, Product News, Mar. 15, 2007.
J. Qian et al., New Charge Pump Power-Factor-Correction Electronic Ballast with a Wide Range of Line Input Voltage, IEEE Transactions on Power Electronics, vol. 14, No. 1, Jan. 1999.
P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.
J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.lrc.rpi.edu/programs/solidstate/completedProjects.asp?ID=76, printed May 3, 2007.

S. Chan et al., Design and Implementation of Dimmable Electronic Ballast Based on Integrated Inductor, IEEE Transactions on Power Electronics, vol. 22, No. 1, Jan. 2007.

M. Madigan et al., Integrated High-Quality Rectifier-Regulators, IEEE Transactions on Industrial Electronics, vol. 46, No. 4, Aug. 1999.

T. Wu et al., Single-Stage Electronic Ballast with Dimming Feature and Unity Power Factor, IEEE Transactions on Power Electronics, vol. 13, No. 3, May 1998.

F. Tao et al., "Single-Stage Power-Factor-Correction Electronic Ballast with a Wide-Continuous Dimming Control for Fluorescent Lamps," IEEE Power Electronics Specialists Conference, vol. 2, 2001.

Azoteq, IQS17 Family, IQ Switch®—ProxSense™ Series, Touch Sensor, Load Control and User Interface, IQS17 Datasheet V2.00.doc, Jan. 2007.

C. Dilouie, Introducing the LED Driver, EC&M, Sep. 2004.

S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

Why Different Dimming Ranges? The Difference Between Measured and Perceived Light, http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.

D. Rand et al., Issues, Models and Solutions for Triac Modulated Phase Dimming of LED Lamps, Power Electronics Specialists Conference, 2007.

Supertex Inc., HV9931 Unity Power Factor LED Lamp Driver, Application Note AN-H52, Mar. 7, 2007.

Supertex Inc., 56W Off-line LED Driver, 120VAC with PFC, 160V, 350mA Load, Dimmer Switch Compatible, DN-H05, Feb. 2007.

ST Microelectronics, Power Factor Corrector L6561, Jun. 2004.

Fairchild Semiconductor, Application Note 42047 Power Factor Correction (PFC) Basics, Rev. 0.9.0 Aug. 19, 2004.

M. Radecker et al., Application of Single-Transistor Smart-Power IC for Fluorescent Lamp Ballast, Thirty-Fourth Annual Industry Applications Conference IEEE, vol. 1, Oct. 3-7, 1999.

M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Fairchild Semiconductor, FAN4800, Low Start-up Current PFC/PWM Controller Combos, Nov. 2006.

Fairchild Semiconductor, FAN4810, Power Factor Correction Controller, Sep. 24, 2003.

Fairchild Semiconductor, FAN4822, ZVS Average Current PFC Controller, Aug. 10, 2001.

Fairchild Semiconductor, FAN7527B, Power Factor Correction Controller, 2003.

Fairchild Semiconductor, ML4821, Power Factor Controller, Jun. 19, 2001.

Freescale Semiconductor, AN1965, Design of Indirect Power Factor Correction Using 56F800/E, Jul. 2005.

International Search Report for PCT/US2008/051072, mailed Jun. 4, 2008.

* cited by examiner

```
(* This Mathematica program emulates a delta-sigma modulator with a
square-law post process.

The delta-sigma modulator ensures that
noise shaping is done appropriately in the post-process domain.
*)
len = 256;
in = Range[len] / len;
dssq[x_] := Module[{state = {}, i0 = 0., i1 = 0., q = 0, fb = 0, qin},
    Do[
        qin = .86i0 + .27i1 + x[[i]] - fb;  (* a mellow, n2d order mod with butter poles *)
        q = q + If[qin>q+ .5, 1, If[(qin< -q+ .5) && (q>0), -1, 0]];  (* quantizer *)
        fb = q*q;  (* square to emulate post-processor *)
        i0 +=x[[i]] - fb; i1 +=i0;  (* update state variable *)
        state = {state, i0, i1, q, fb};
        , {i, len}];
    Transpose[Partition[Flatten[state], 4]]
];

In[66]:- a = dssq[in*30.];
    ListPlot[in*30, PlotJoined → True];
    ListPlot[a[[3]], PlotJoined → True];
    ListPlot[a[[4]], PlotJoined → True];
```

CONTROL SYSTEM USING A NONLINEAR DELTA-SIGMA MODULATOR WITH NONLINEAR PROCESS MODELING

CROSS-REFERENCE TO RELATED APPLICATION

This application claims the benefit under 35 U.S.C. § 119 (e) and 37 C.F.R. § 1.78 of U.S. Provisional Application No. 60/915,547, filed May 2, 2007, and entitled "Power Factor Correction (PFC) Controller Apparatuses and Methods," and is incorporated by reference in its entirety.

BACKGROUND OF THE INVENTION

1. Field of the Invention

The present invention relates in general to the field of signal processing, and more specifically to a control system utilizing a nonlinear delta-sigma modulator having a nonlinear feedback model that models a nonlinear process.

2. Description of the Related Art

Many electronic systems utilize nonlinear processes to generate output signals. For example, plant systems, such as servo control systems and power conversion systems, often utilize nonlinear processes. Power conversion systems often utilize a switching power converter to convert alternating current (AC) voltages to direct current (DC) voltages or DC-to-DC. Switching power converters often include a nonlinear energy transfer process to provide power factor corrected energy to a load.

FIG. 1 depicts a plant and control system 100, which includes a switching power converter 102 and a plant 104. Plant 104 is, for example, a servo control system or a power supply system. The switching power converter 102 provides constant voltage power to load 112. The switching power converter 102 operates in accordance with a nonlinear process in discontinuous current mode. A full, diode bridge rectifier 103 rectifies AC voltage $V_{in}(t)$ provided by AC voltage source 101 to generate a rectified, time-varying input voltage $V_x(t)$. The switch 108 of switching power converter 102 regulates the transfer of energy from the rectified, time-varying input voltage $V_x(t)$, through inductor 110, to capacitor 106. The peak of input current $i_{in}$ is proportionate to the 'on-time' of switch 108, and the energy transferred is proportionate to the 'on-time' squared. Thus, the energy transfer process is one embodiment of a nonlinear process. In at least one embodiment, control signal $C_S$ is a pulse width modulated signal, and the switch 108 is an n-channel field effect transistor that conducts when the pulse width of $C_S$ is high. Thus, the 'on-time' of switch 108 is determined by the pulse width of control signal $C_S$. Accordingly, the energy transferred is proportionate to a square of the pulse width of control signal $C_S$. Diode 111 prevents reverse current flow into inductor 110. Energy transferred from inductor 110 is stored by capacitor 106. Capacitor 106 has sufficient capacitance to maintain an approximately constant voltage $V_C$ while providing current to load 112. In at least one embodiment, the switching power converter 102 is a boost-type converter, i.e. the voltage $V_C$ is greater than the peak of input voltage $V_x(t)$.

The plant and control system 100 also includes a switch state controller 114. The switch state controller 114 generates control signal $C_S$ with a goal of causing switching power converter 102 to transfer a desired amount of energy to capacitor 106, and, thus, to load 112. The desired amount of energy depends upon the voltage and current requirements of load 112. To provide power factor correction close to one, switch state controller 114 seeks to control the input current $i_{in}$ so that input current $i_{in}$ tracks the input voltage $V_x(t)$ while holding the capacitor voltage $V_C$ constant.

The process of transferring energy from inductor 110 to capacitor 106 represents a nonlinear process. The peak of input current $i_{in}$ is proportionate to the pulse width of the control signal $C_S$, i.e. the 'on' (conductive) time of switch 108, and the energy transferred to capacitor 106 is proportionate to the square of the pulse width of the control signal $C_S$ and inversely proportionate to the period of control signal $C_S$. Thus, the energy transfer process between inductor 110 and capacitor 106 is inherently nonlinear. Because the energy transfer process of switching power converter 102 is nonlinear, generation of control signal $C_S$ to maintain power correction, efficiency, and stable output power is inherently more difficult.

SUMMARY OF THE INVENTION

In one embodiment of the present invention, a signal processing system includes a nonlinear delta-sigma modulator. The nonlinear delta-sigma modulator includes a loop filter, a quantizer coupled to the loop filter, and a feedback path coupled between the loop filter and the quantizer, wherein the feedback path includes a nonlinear feedback model that models nonlinearity of a nonlinear process of a power factor correction circuit.

In another embodiment of the present invention, a method of processing signals utilizing a nonlinear delta-sigma modulator configured to model nonlinearities of a nonlinear system process includes generating a quantizer output signal. The method further includes applying a nonlinear function to the quantizer output signal in a feedback loop of the nonlinear delta-sigma modulator to generate a feedback signal, wherein the nonlinear function models the nonlinearities of the nonlinear process and combining the feedback signal with a nonlinear delta-sigma modulator input signal to generate a difference signal.

In a further embodiment of the present invention, a control system to provide a control signal to a nonlinear plant, wherein the nonlinear plant generates a response signal that is responsive to the control signal, includes a nonlinear delta-sigma modulator. The nonlinear delta-sigma modulator includes a loop filter, a quantizer coupled to the loop filter, and a feedback path coupled between the loop filter and the quantizer, wherein the feedback path includes a nonlinear feedback model that models nonlinearity of a nonlinear plant process of the nonlinear plant. During operation, the nonlinear delta-sigma modulator is configured to generate a quantizer output signal to control at least one aspect of the control signal and the nonlinear delta-sigma modulator is configured to shape noise in a spectral domain of the response signal.

In another embodiment of the present invention, a method of controlling a nonlinear process, wherein the nonlinear process generates an output signal responsive to a control signal generated by a control system, includes receiving an input signal. The method further includes spectrally shaping the input signal with a nonlinear delta-sigma modulator to shift noise out of a baseband of the nonlinear process output signal and generating a nonlinear delta-sigma modulator output signal having a value representing the spectral shaping of the input signal. The method also includes using the nonlinear delta-sigma modulator output signal to generate the control signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 7 depicts a program that emulates a nonlinear delta-sigma modulator.

DETAILED DESCRIPTION

A control system includes a nonlinear delta-sigma modulator, and the nonlinear delta-sigma modulator includes a nonlinear process model that models a nonlinear process in a signal processing system, such as a nonlinear plant. The nonlinear delta-sigma modulator generates one or more signals that can be used to, for example, control a nonlinear process. Conventional delta-sigma modulators spectrally shape the output signal of the delta-sigma modulator to shift noise out of the baseband of the delta-sigma modulator output signal rather than spectrally shaping noise in the spectral domain of the nonlinear process response signal. In at least one embodiment, the nonlinear delta-sigma modulator includes a feedback model that models the nonlinear process being controlled and facilitates spectral shaping to shift noise out of a baseband in a spectral domain of a response signal of the nonlinear process.

In at least one embodiment, the nonlinear delta-sigma modulator is part of a control system that controls power factor correction and output voltage of a switching power converter. In at least one embodiment, the switching power converter includes a switch to regulate energy transfer from a power factor correction stage to a load and regulate the output voltage of the switching power converter. The conductivity of the switch is controlled by a pulse width modulated control signal generated by the control system that includes the nonlinear delta-sigma modulator. The control system controls the pulse width and period of the control signal to control power factor correction and the output voltage level. In at least one embodiment, the nonlinear delta-sigma modulator generates a signal to control the pulse width of the control signal, and another subsystem generates a signal to control the period of the control signal.

Figure 1:
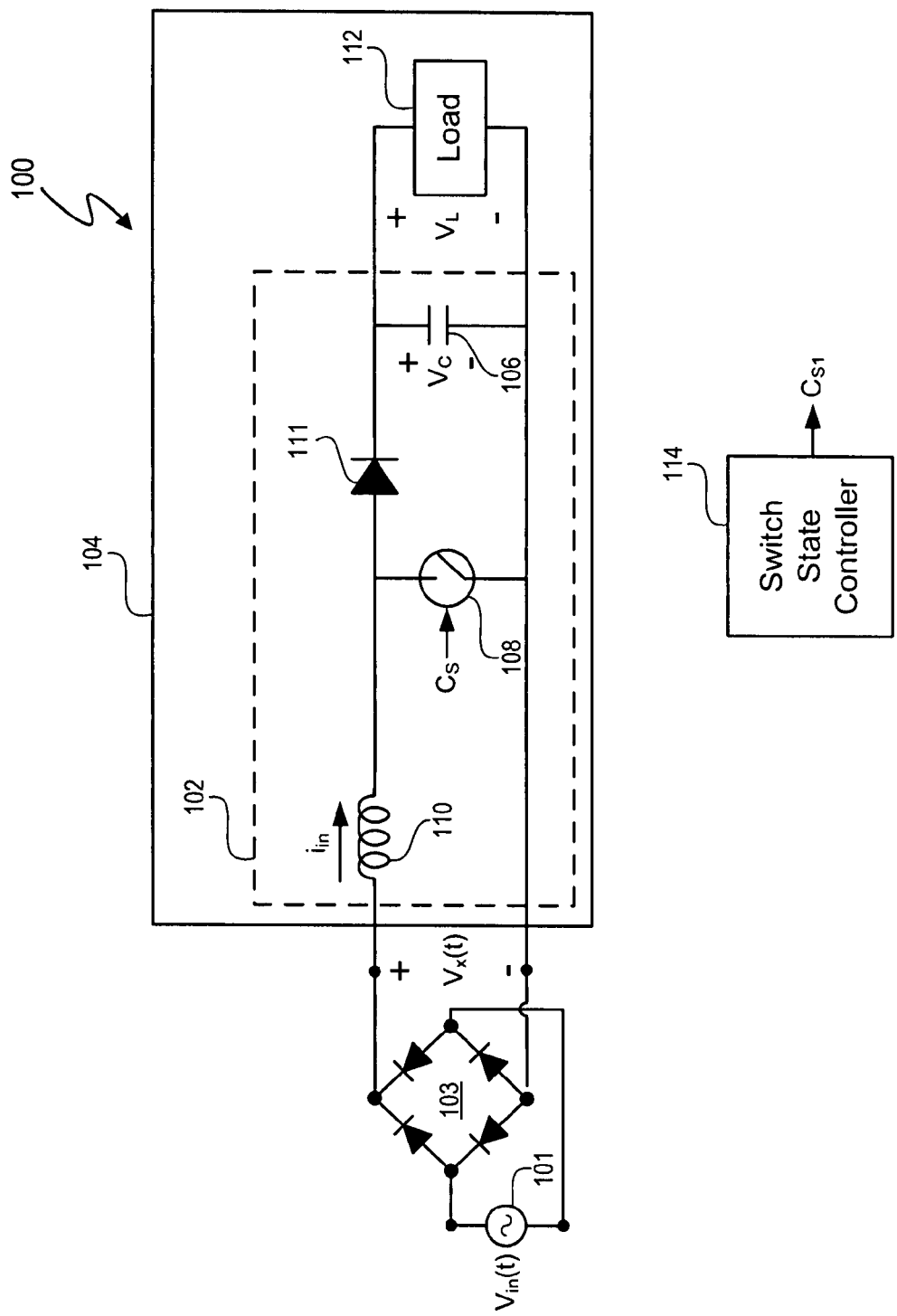
FIG. 1 (labeled prior art) depicts a switching power converter with a power factor correction stage.
Figure 2:
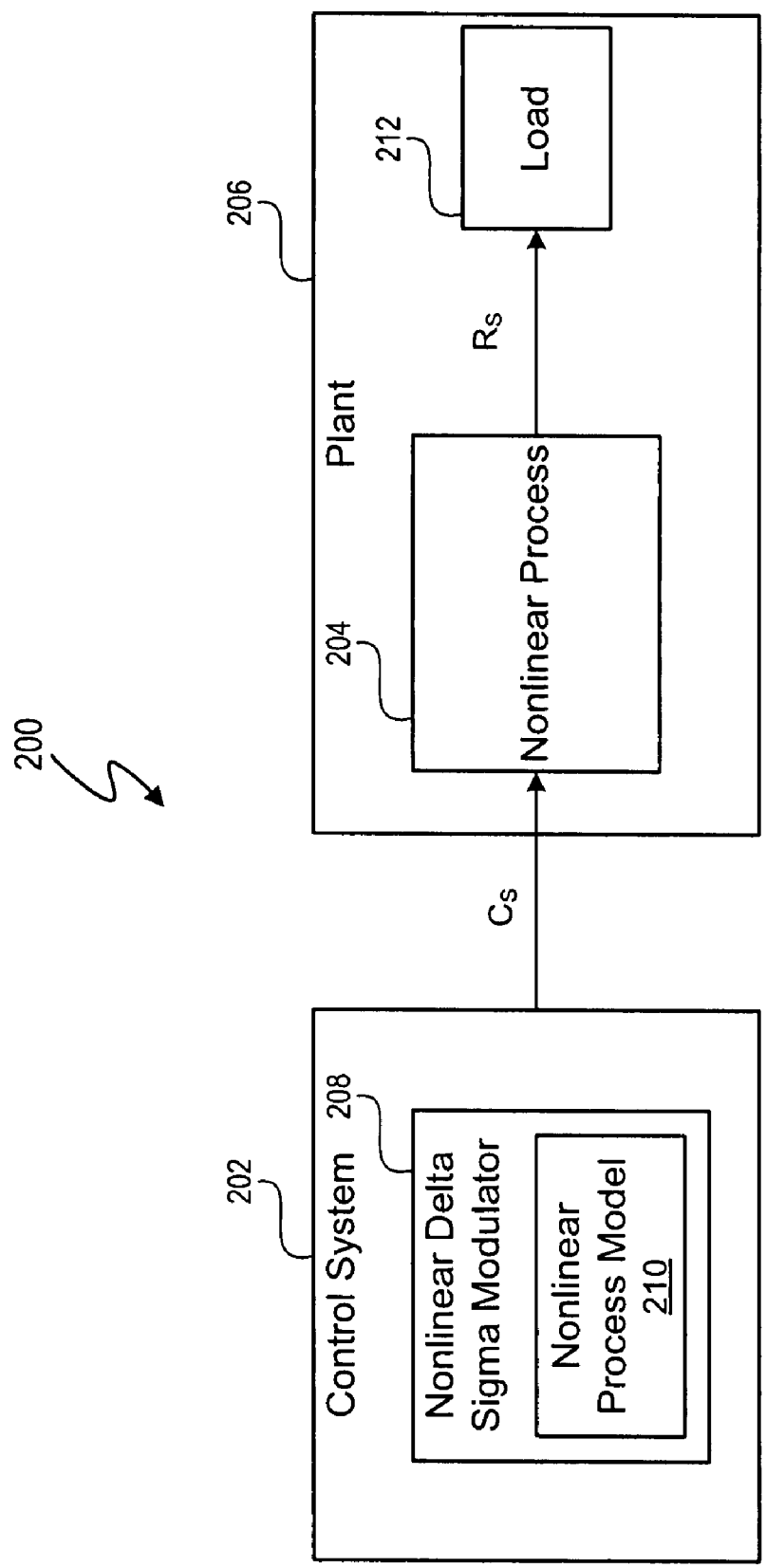
FIG. 2 depicts a nonlinear system having a nonlinear delta-sigma modulator.

FIG. 2 depicts a plant and control system 200. The plant and control system 200 includes control system 202 and plant 206. Control system 202 generates a control signal $C_S$ that controls the nonlinear process 204 of plant 206. In response to the control signal $C_S$ the nonlinear process 204 generates a response signal $R_S$. In at least one embodiment, the nonlinear process 204 is a square function. For example, in at least one embodiment, plant 206 is a power converter, and the nonlinear process 204 represents an energy transfer process from an input stage to a load 212. The load 212 can be any load and includes for example, another power transfer stage. The control system 202 includes a nonlinear delta-sigma modulator 208, and the nonlinear delta-sigma modulator 208 includes a nonlinear process model 210 that models nonlinearities of nonlinear process 204. As explained subsequently in more detail, the nonlinear delta-sigma modulator 208 is used by control system 202 to generate the control signal $C_S$.

In at least one embodiment, the control system 202 generates the control signal $C_S$ so that the frequency spectrum of the response signal $R_S$ is noise shaped, i.e. noise is shifted out of the response signal $R_S$ baseband frequencies and into out-of-band frequencies. Many plants have a natural low pass frequency response. Thus, noise shaping removes noise at low frequencies and prevents the noise from otherwise becoming part of the control signal $C_S$. Shifting noise out of the baseband of response signal $R_S$ removes unwanted signals from the response signal $R_S$ that could, for example, adversely affect the operation of the load 212 and/or be parasitically coupled to other circuits in the plant 206. The nonlinear process model 210 facilitates the noise shaping of the response signal $R_S$ by modeling the nonlinear process 204.

Figure 3:
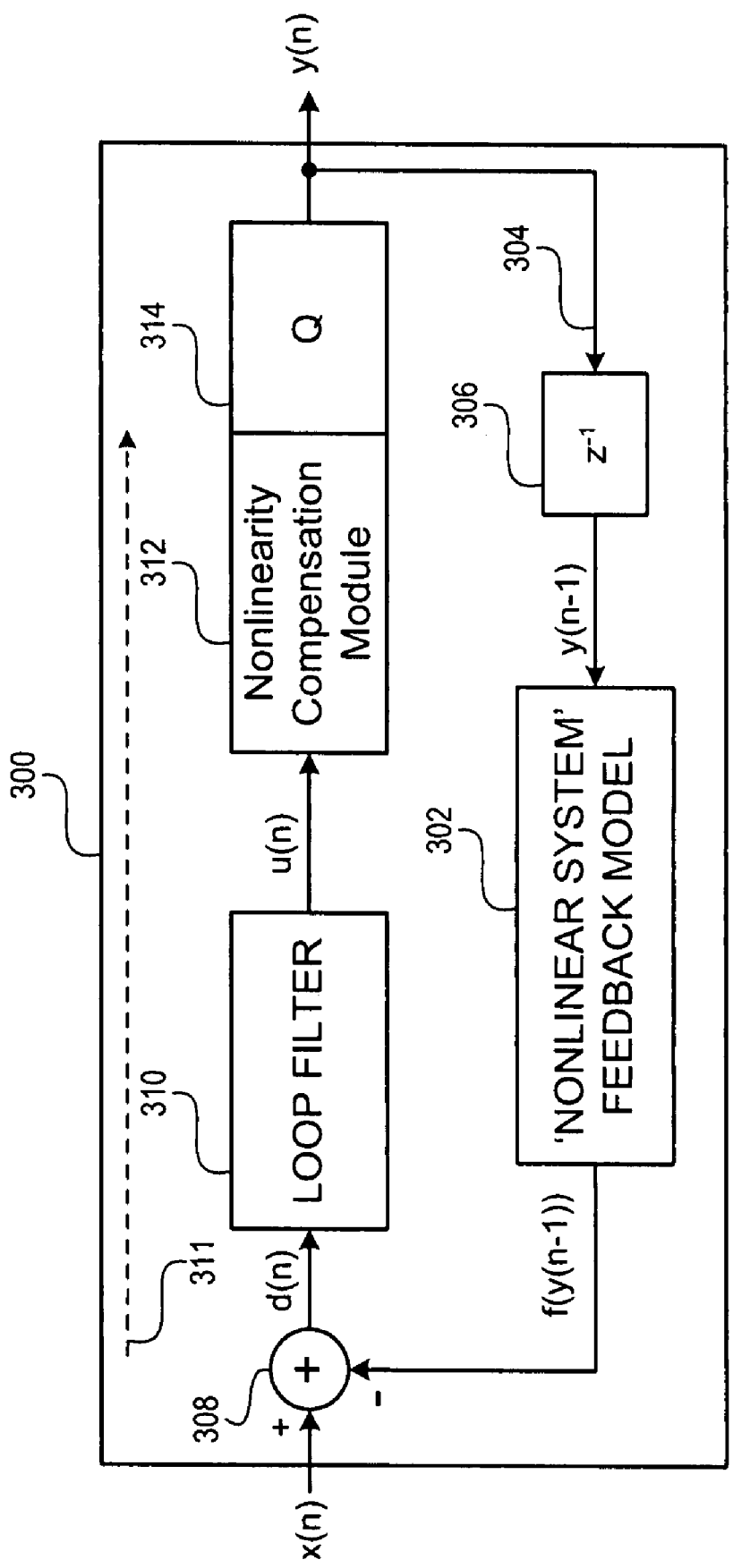
FIG. 3 depicts a nonlinear delta-sigma modulator.

FIG. 3 depicts a nonlinear delta-sigma modulator 300, which is one embodiment of nonlinear delta-sigma modulator 208. The nonlinear delta-sigma modulator 300 includes a 'nonlinear system' feedback model 302 in a feedback path 304 of nonlinear delta-sigma modulator 300. The feedback model 302 models nonlinearities of nonlinear process 204. In at least one embodiment, the feedback model 302 is represented by f(x). The nonlinear delta-sigma modulator output signal y(n) is fed back through a delay 306, and the feedback model 302 processes the delayed quantizer output signal y(n−1) in accordance with f(y(n−1)). The combiner 308 determines a difference signal d(n) representing a difference between the feedback model 302 output f(y(n−1)) and an input signal x(n). A $k^{th}$ order loop filter 310 filters the difference signal d(n) to generate a loop filter output signal u(n), where k is an integer greater than or equal to one and the value of k is a design choice. Generally, increasing values of k decrease baseband noise and increase out-of-band noise.

The nonlinear delta-sigma modulator 300 includes a nonlinearity compensation module 312. However, in at least one embodiment, a nonlinearity compensation module is not included as part of the nonlinear delta-sigma modulator 300. The nonlinearity compensation module 312 compensates for nonlinearities introduced by the nonlinear feedback model 302. In at least one embodiment, the nonlinearity compensation module 312 processes the loop filter output signal u(n) using a compensation function $f^1(x)$, which is an inverse of the feedback model 302 function f(x), e.g. if $f(x)=x^2$ then $f^1(x)=x^{1/2}$. Quantizer 314 quantizes the output of compensation module 312 to determine a nonlinear delta-sigma modulator 300 output signal y(n). In at least one embodiment, the compensation function $f^1(x)$ of compensation module 312 is an estimate of the inverse of the nonlinear system feedback model 302. In at least one embodiment, the compensation function $f^1(x)$ in the forward path 311 of nonlinear delta-sigma modulator 300 provides good noise shaping across all frequencies. In at least one embodiment, an imperfect compensation function, i.e. approximate $f^1(x)$, allows more noise at all frequencies. In at least one embodiment, the compensation function $f^1(x)$ provides stability to nonlinear delta-sigma modulator 300.

In at least one embodiment, the nonlinearity compensation module 312 is incorporated as part of the quantizer 314 rather than as a process separate from a quantization process. The compensation module 312 causes the quantizer 314 to quantize the loop filter output signal u(n) in accordance with a quantization compensation function. In at least one embodiment, the quantizer compensation function determines the nonlinear delta-sigma modulator output signal y(n) in accordance with a derivative df(x) of the feedback model 302. For example, if the nonlinear system feedback model 302 function f(x) equals $x^2$, then the quantizer compensation function is 2x. The quantizer compensation function can be estimated as x. Decision points of the quantizer 314 are then x+/−½.

Figure 4:
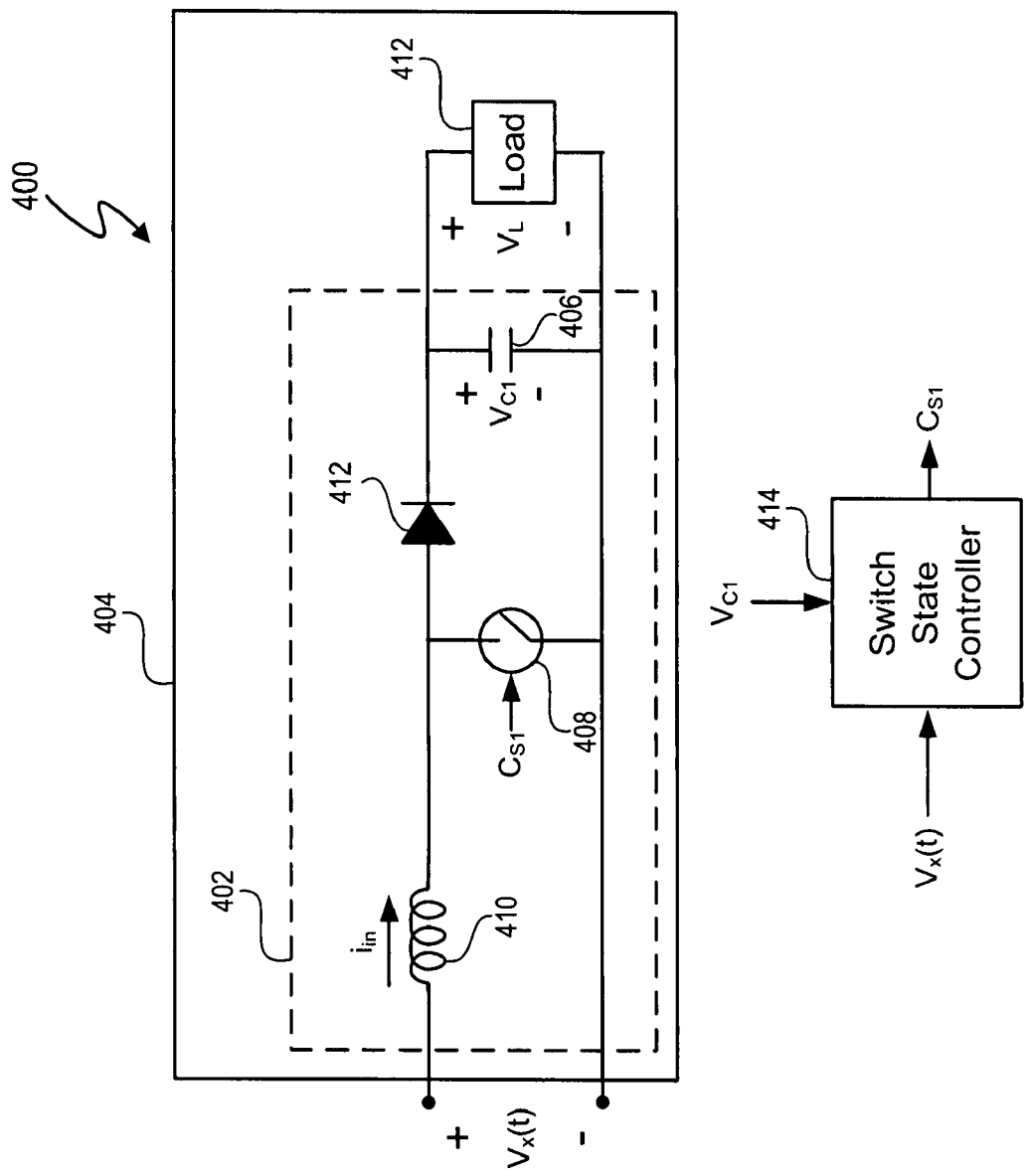
FIG. 4 depicts a plant and control system.

FIG. 4 represents a plant and control system 400, which is one embodiment of plant and control system 200. The plant and control system 400 includes a switching power converter 402 and a plant 404. Plant 404 represents an embodiment of plant 206. The switching power converter 402 operates in accordance with a nonlinear process in discontinuous current mode. The switch 408 of switching power converter 402 regulates the transfer of energy from the rectified, time-varying input voltage $V_x(t)$, through inductor 410, to capacitor 406. The peak of input current $i_{in}$ is proportionate to the 'on-time' of switch 408, and the energy transferred is proportionate to the 'on-time' squared. In at least one embodiment, control signal $C_{S1}$ is a pulse width modulated signal, and the switch 408 is an n-channel field effect transistor that conducts when the pulse width of $C_{S1}$ is high. Thus, the 'on-time' of switch 408 is determined by the pulse width of control signal $C_{S1}$. Accordingly, the energy transferred is proportionate to a square of the pulse width of control signal $C_{S1}$. Thus, the energy transfer process is a squaring process and represents one embodiment of nonlinear process 204. Diode 412 prevents reverse current flow into inductor 410. Energy transferred from inductor 410 is stored by capacitor 406. Capacitor 406 has sufficient capacitance to maintain an approximately constant voltage $V_{C1}$ while providing current to load 412. In at least one embodiment, the switching power converter 402 is a boost-type converter, i.e. the voltage $V_{C1}$ is greater than the peak of input voltage $V_x(t)$.

The plant and control system 400 also includes a switch state controller 414, which represents one embodiment of control system 202. The switch state controller 414 controls the pulse width PW and period T of control signal $C_{S1}$. Thus, switch state controller 414 controls the nonlinear process of switching power converter 402 so that a desired amount of energy is transferred to capacitor 406. The desired amount of energy depends upon the voltage and current requirements of load 412. The duty cycle of control signal $C_{S1}$ is set to maintain the desired capacitor voltage $V_{C1}$ and load voltage $V_L$, and, in at least one embodiment, the duty cycle D of control signal $C_{S1}$ equals $[V_L/(V_{C1}+V_L)]$. Energy transfer increases during a period of time as the input voltage $V_x(t)$ increases. To regulate the amount of energy transferred and maintain a power factor correction close to one, switch state controller 414 varies the period of control signal $C_{S1}$ so that the input current $i_{in}$ tracks the changes in input voltage $V_x(t)$ and holds the capacitor voltage $V_{C1}$ constant. Thus, as the input voltage $V_x(t)$ increases, switch state controller 414 increases the period T of control signal $C_{S1}$, and as the input voltage $V_x(t)$ decreases, switch state controller 414 decreases the period of control signal $C_{S1}$. At the same time, the pulse width PW of control signal $C_{S1}$ is adjusted to maintain a constant duty cycle D, and, thus, hold the capacitor voltage $V_{C1}$ constant. In at least one embodiment, the switch state controller 414 updates the control signal $C_{S1}$ at a frequency much greater than the frequency of input voltage $V_x(t)$. The frequency of input voltage $V_x(t)$ is generally 50-60 Hz. The frequency 1/T of control signal $C_{S1}$ is, for example, between 25 kHz and 100 kHz. Frequencies at or above 25 kHz avoid audio frequencies and at or below 100 kHz avoid significant switching inefficiencies while still maintaining good power factor correction, e.g. between 0.9 and 1, and an approximately constant capacitor voltage $V_{C1}$.

Figure 5:
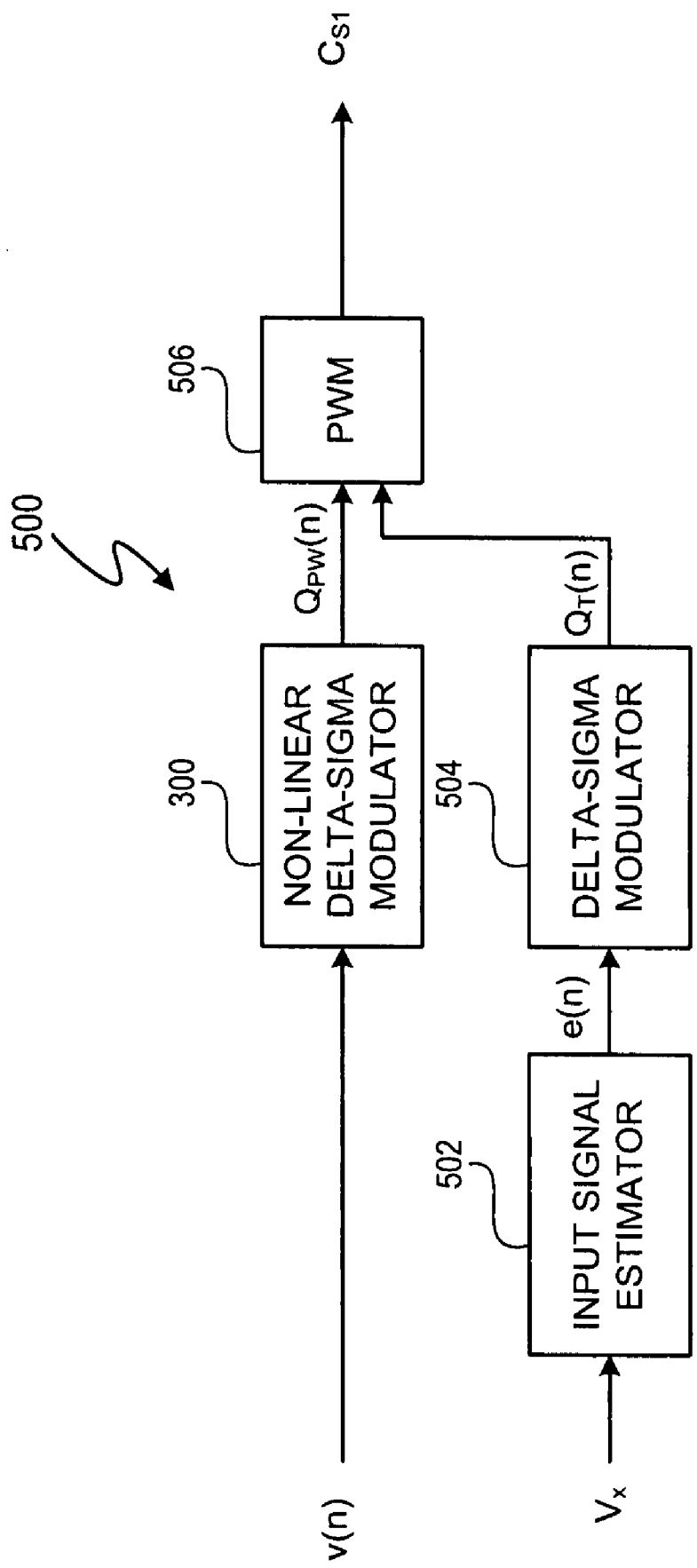
FIG. 5 depicts a switch state controller.

FIG. 5 depicts switch state controller 500, which represents one embodiment of switch state controller 414. The switch state controller 500 generates the control signal $C_{S1}$ to control the nonlinear energy transfer process of switching power converter 402. The nonlinear delta-sigma modulator 300 receives an input signal v(n) indicating a desired amount of energy transfer during the next cycle of control signal $C_{S1}$ to maintain a desired load voltage $V_L$. The nonlinear delta-sigma modulator 300 processes the input signal v(n) and generates a quantizer output signal $Q_{PW}(n)$. The nonlinear feedback model 302 (FIG. 3) of nonlinear delta-sigma modulator 300 models the nonlinear energy transfer process of switching power converter 402 so that the quantizer output signal $Q_{PW}$ represents a pulse width for control signal $C_{S1}$ that matches the energy transfer needed by capacitor 406 to maintain an approximately constant load voltage $V_L$. The input signal v(n) is discussed in more detail in conjunction with FIG. 4.

In at least one embodiment, input signal $V_x(t)$ is a rectified voltage and, thus, rises and falls over time. The switch state controller 500 is configured to track the changes in input signal $V_x(t)$ and adjust the period of control signal $C_{S1}$ to increase as input signal $V_x(t)$ increases and to decrease as input signal $V_x(t)$ decreases. To determine each period of control signal $C_S$, switch state controller 500 includes an input signal estimator 502 to estimate the instantaneous values of input voltage $V_x(t)$ for each cycle of control signal $C_{S1}$ and generate an estimated voltage value e(n). The input signal $V_x$ to input signal estimator 502 is, for example, an actual or scaled version of the input voltage $V_x(t)$ or sample of the input voltage $V_x(t)$. The switch state controller 500 includes a conventional delta-sigma modulator 504 to process the estimated voltage value e(n) and convert the estimated voltage value e(n) into a quantizer output signal $Q_T(n)$. The quantizer output signal $Q_T(n)$ represents a period of control signal $C_{S1}$ for the estimated value of input voltage $V_x(t)$. Exemplary conventional delta-sigma modulator design and operation is described in the book *Understanding Delta-Sigma Data Converters* by Schreier and Temes, IEEE Press, 2005, ISBN 0-471-46585-2.

The switch state controller 500 includes a pulse width modulator 506 to convert the quantizer output signal $Q_{PW}(n)$ into a pulse width and quantizer output signal $Q_T(n)$ into a period for control signal $C_{S1}$, where n can be a number representing a particular instance of the associated variable. To perform the conversions, in at least one embodiment, pulse with modulator 506 includes a counter. The quantizer output signal $Q_{PW}(n)$ indicates that number of counts for the pulse width of control signal $C_{S1}$, and the quantizer output signal $Q_T(n)$ indicates the number of counts for the period of control signal $C_{S1}$. The pulse width modulator 506 translates the number of counts for the quantizer output signal $Q_{PW}(n)$ and the quantizer output signal $Q_T(n)$ into the respective pulse width and period of control signal $C_{S1}$. In at least one embodiment, switch state controller 500 is implemented using digital technology. In other embodiments, switch state controller 500 can be implemented using analog or mixed digital and analog technology.

Referring to FIGS. 3, 4, and 5, when nonlinear delta-sigma modulator 300 is used as part of a switch state controller, such as switch state controller 500 (FIG. 5), for maintaining power factor correction, the input signal v(n) is proportional to (1−$(V_x(t)/V_{C1})$·K. "$V_x(t)$" and "$V_{C1}$" are described in conjunction with FIG. 4. "K" is a constant representing power demand by load 412 as determined by a proportional integral compensator (not shown) that compares the load voltage $V_L$ (FIG. 4) to a reference voltage and determines a feedback signal that is a combination of an integral and proportionate function of the output voltage error. An example of a proportional integral compensator is described in Alexander Prodić, "Compensator Design and Stability Assessment for Fast Voltage Loops of Power Factor Correction Rectifiers", IEEE Transactions on Power Electronics, Vol. 22, No. 5, September 2007 and Erickson and Maksomović, "Fundamentals of Power Electronics", 2$^{nd}$ ed., Boston, Mass.: Kluwer, 2000. The input signal v(n) is constrained to ensure that switching power converter 402 operates in discontinuous current mode.

Figure 6:
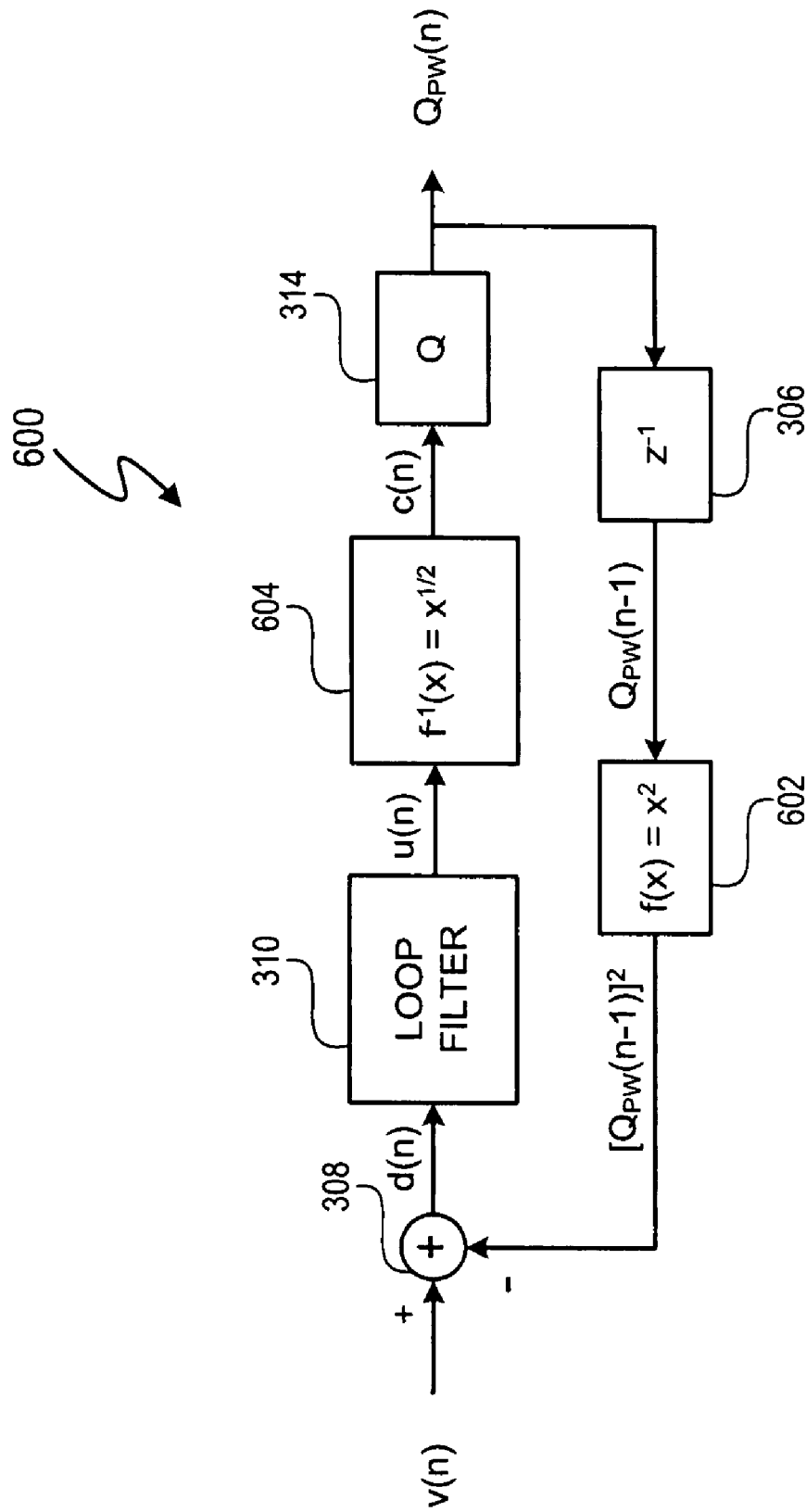
FIG. 6 depicts a nonlinear delta-sigma modulator with a squaring nonlinear system feedback model.

FIG. 6 depicts nonlinear delta-sigma modulator 600, which represents one embodiment of nonlinear delta-sigma modulator 300. The nonlinear energy transfer process of switching power converter 402 can be modeled as a square function, $x^2$. Nonlinear delta-sigma modulator 600 includes a nonlinear system feedback model 602 represented by $x^2$. Thus, the output of feedback model 602 is the square of the delay-by-one quantizer output signal $Q_{PW}(n)$, i.e. $[Q_{PW}(n-1)]^2$. The nonlinear delta-sigma modulator 600 in the same manner as nonlinear delta-sigma modulator 300 and includes a compensation module 604 that is separate from quantizer 314. The nonlinearity compensation module 604 processes output signal u(n) of the loop filter 310 with a square root function $x^{1/2}$. The output c(n) of compensation module 604 is quantized by quantizer 314 to generate quantizer output signal $Q_{PW}(n)$.

FIG. 7 depicts a Mathematica® program that emulates nonlinear delta-sigma modulator 300 for function $f(x)=x^2$ of a nonlinear feedback model 302 and a nonlinearity compensation module 312 implemented as a quantizer compensation function representing a modified derivative of f(x) with quantizer decision points of x+/−½. The Mathematica® program is available from Wolfram Research, Inc. with an office in Champaign, Ill.

Figure 8:
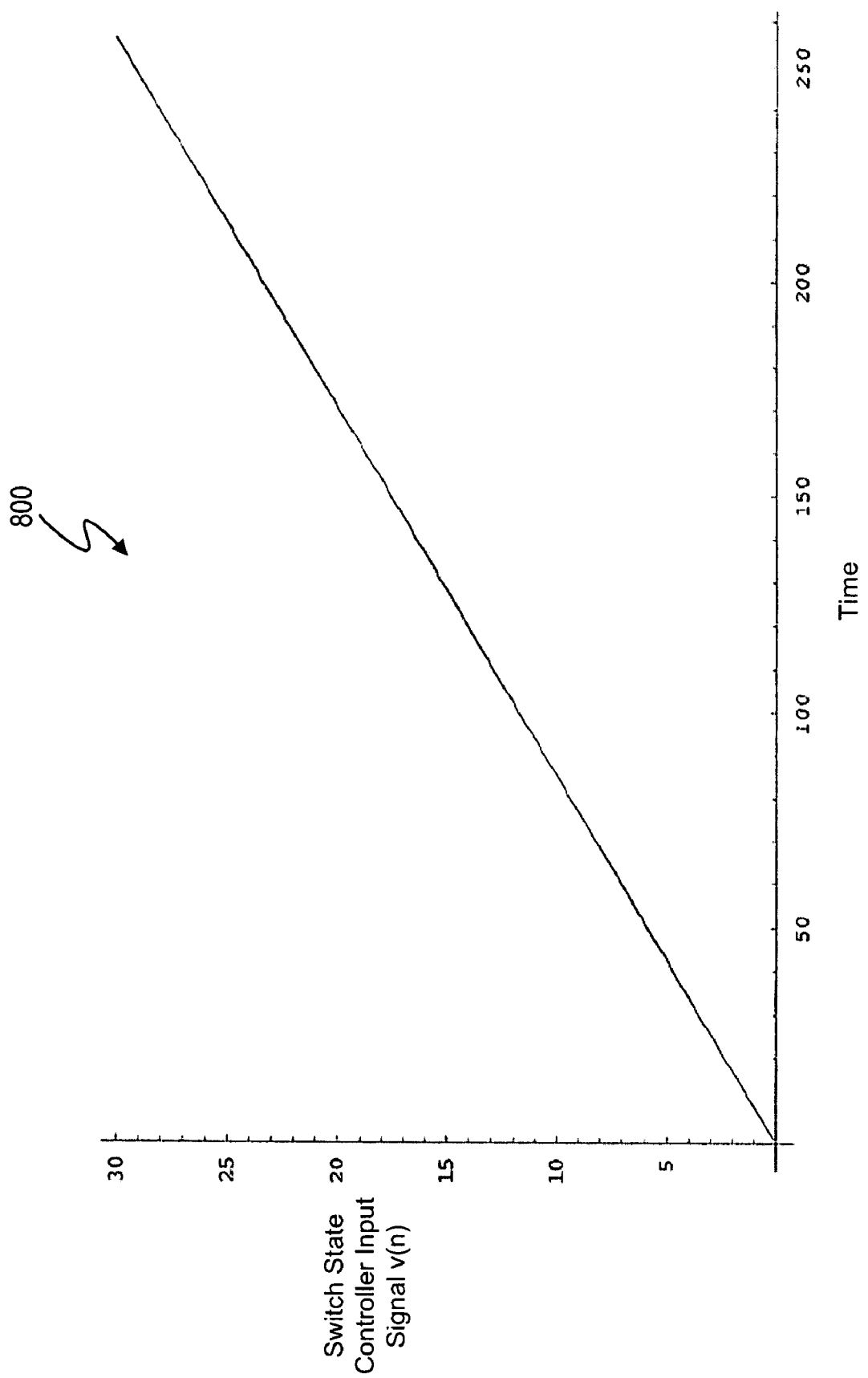
FIG. 8 depicts a graph of a switch state controller input signal over time.

FIG. 8 depicts a graph 800 of switch state controller input signal v(n) over time. The switch state controller input signal v(n) is linear over time and tracks changes in the time-varying input voltage $V_x(t)$ so that energy transfer in switching power converter 402 tracks changes in the input voltage $V_x(t)$.

Figure 9:
FIG. 9 depicts a graph of a nonlinear delta-sigma modulator output signal over time.

FIG. 9 depicts a graph 900 of nonlinear delta-sigma modulator output signal $Q_{PW}(n)$ of nonlinear delta-sigma modulator 600 (FIG. 6) over time. The nonlinear delta-sigma modulator 600 performs a square root operation so that the average of output signal $Q_{PW}(n)$, as indicated by dashed line 902, is the square root of switch state controller input signal v(n).

Figure 10:
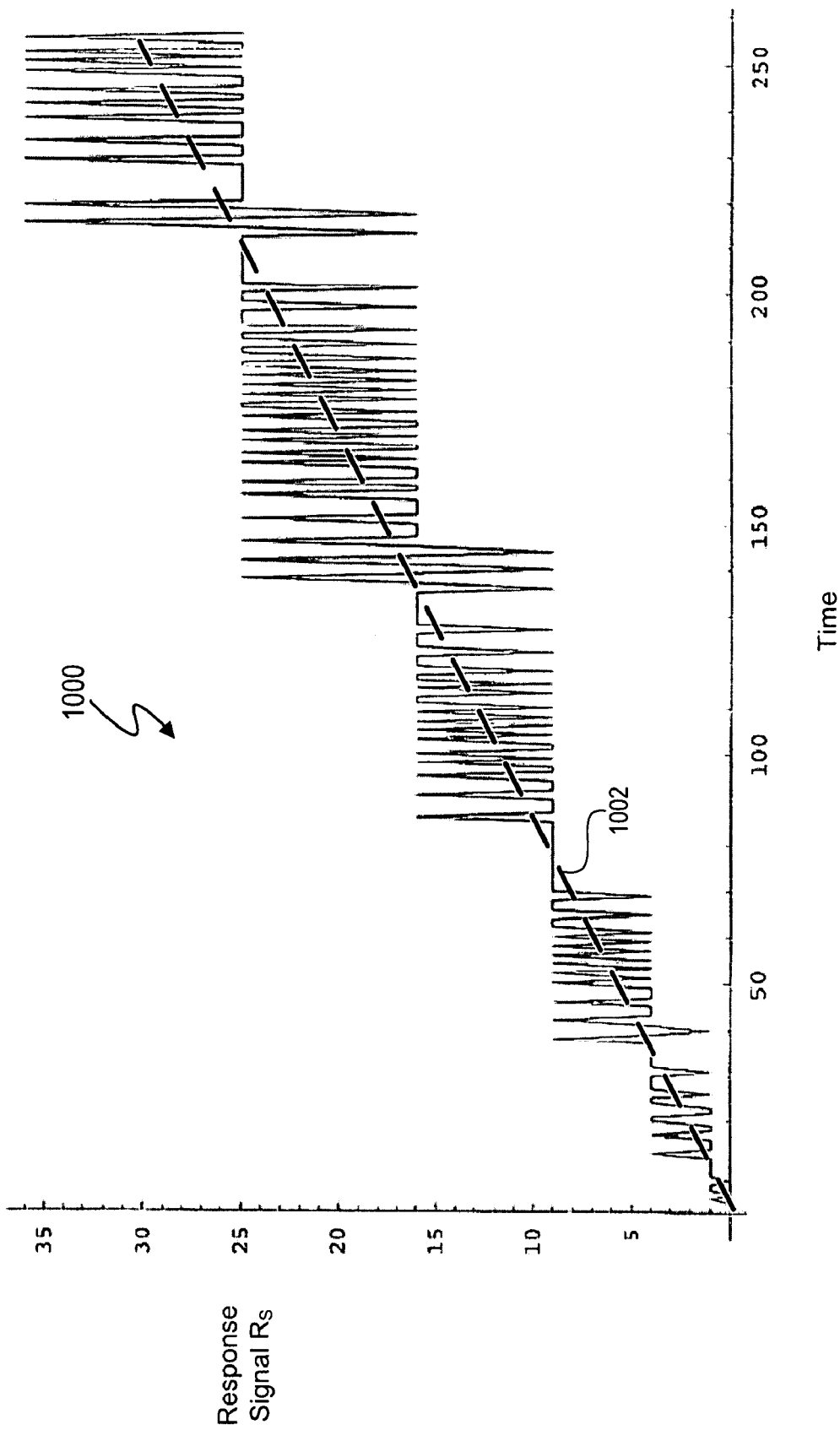
FIG. 10 depicts plant energy transfer over time.

FIG. 10 depicts a graph 1000 of a response signal $R_s$ of nonlinear process 204 of plant 206 to an input stimulus represented by graph 900 when the nonlinear process 203 has an $x^2$ transfer function. Because the nonlinear delta-sigma modulator 600 includes the nonlinear system feedback model 602 that models the squaring energy transfer process of switching power converter 402, the response signal $R_S$ is linear as indicated by dashed line 1002.

Thus, the nonlinear delta-sigma modulator includes a feedback model that models a nonlinear process being controlled and facilitates spectral shaping to shift noise out of a baseband in a spectral domain of a response signal of the nonlinear process.

Although the present invention has been described in detail, it should be understood that various changes, substitutions and alterations can be made hereto without departing from the spirit and scope of the invention as defined by the appended claims.

What is claimed is:

1. A signal processing system comprising:
a nonlinear delta-sigma modulator, wherein:
the nonlinear delta-sigma modulator includes:
a loop filter;
a quantizer coupled to the loop filter; and
a feedback path coupled between the loop filter and the quantizer, wherein the feedback path includes a nonlinear feedback model that models nonlinearity of a nonlinear process of a power factor correction circuit.

2. The signal processing system of claim 1 wherein the nonlinear delta-sigma modulator includes a compensation module in a forward path of the nonlinear delta-sigma modulator to compensate for nonlinearities of the nonlinear feedback model.

3. The signal processing system of claim 2 wherein the compensation module includes an inverse model coupled to the quantizer, wherein the inverse model models an inverse of the nonlinear feedback model.

4. The signal processing system of claim 3 wherein the nonlinear feedback model models a square function and the inverse model models a square root function.

5. The signal processing system of claim 2 wherein the compensation module comprises one or more quantizer components to determine a quantizer output in accordance with an approximation of an inverse of the nonlinear feedback model.

6. The signal processing system of claim 1 wherein the nonlinear process of the power factor correction circuit comprises a process of transferring energy from a time-varying voltage source through an inductor of the power factor correction circuit.

7. The signal processing system of claim 6 wherein, during operation, the quantizer of the nonlinear delta-sigma modulator generates an output signal associated with a pulse width of a control signal used to control a power factor regulation switch in the power factor correction circuit, the signal processing system further comprising a power factor correction control circuit, wherein the power factor correction control circuit comprises:
a signal estimator to generate an estimated value of the time-varying input signal at discrete instances in time;
a first delta-sigma modulator, coupled to the signal estimator, to process the estimated value of the time-varying input signal and generate an output associated with a period of the control signal used to control the power factor regulation switch; and
a pulse-width modulator, coupled to the nonlinear delta-sigma modulator and the first delta-sigma modulator to generate the control signal used to control the power factor regulation switch, wherein the pulse width of the control signal is determined using the output signal of the nonlinear delta-sigma modulator quantizer and the period is determined by the switch period signal generator.

8. A method of processing signals utilizing a nonlinear delta-sigma modulator configured to model nonlinearities of a nonlinear system process, the method comprising:
generating a quantizer output signal;
applying a nonlinear function to the quantizer output signal in a feedback loop of the nonlinear delta-sigma modulator to generate a feedback signal, wherein the nonlinear function models the nonlinearities of the nonlinear process; and
combining the feedback signal with a nonlinear delta-sigma modulator input signal to generate a difference signal.

9. The method of claim 8 further comprising:
filtering the difference signal; and
compensating for the application of the nonlinear function in the feedback loop of the nonlinear delta-sigma modulator.

10. The method of claim 9 wherein filtering the difference signal generates a filtered difference signal and compensating for the application of the nonlinear function in the feedback loop of the nonlinear delta-sigma modulator comprises quantizing the filtered difference signal to determine a quantizer output in accordance with an approximation of an inverse of the nonlinear function.

11. The method of claim 10 wherein the approximation of the inverse of the nonlinear function comprises a derivative of the nonlinear function.

12. The method of claim 9 wherein filtering the difference signal generates a filtered difference signal and compensating for the application of the nonlinear function in the feedback loop of the nonlinear delta-sigma modulator comprises:
applying an inverse of the nonlinear function to the filtered difference signal.

13. The method of claim 12 wherein the nonlinear function comprises a squaring function.

14. The method of claim 8 wherein combining the feedback signal with the nonlinear delta-sigma modulator input signal comprises subtracting the feedback signal from the nonlinear delta-sigma modulator input signal.

15. The method of claim 8 further comprising:
converting an output signal of the nonlinear delta-sigma modulator to a timing signal to determine a pulse width control signal;
generating an estimated value of the time-varying input signal at discrete instances in time;
determining a switch frequency signal, wherein the switch frequency signal corresponds to the processed estimated value of the signal generator;
generating a pulse-width modulated switch control signal to control a pulse width of the switch control signal in accordance with the timing signal and a frequency of the switch control signal in accordance with the switch frequency signal; and
applying the switch control signal to a switch of the switching power converter to control energy transfer to and from an inductor of the switching power converter.

16. A control system to provide a control signal to a nonlinear plant, wherein the nonlinear plant generates a response signal that is responsive to the control signal, the control system comprising:
a nonlinear delta-sigma modulator, wherein:
the nonlinear delta-sigma modulator includes:
a loop filter;
a quantizer coupled to the loop filter; and
a feedback path coupled between the loop filter and the quantizer, wherein the feedback path includes a nonlinear feedback model that models nonlinearity of a nonlinear plant process of the nonlinear plant; and
wherein, during operation, the nonlinear delta-sigma modulator is configured to generate a quantizer output signal to control at least one aspect of the control signal and the nonlinear delta-sigma modulator is configured to shape noise in a spectral domain of the response signal.

17. The signal processing system of claim 16 wherein the nonlinear plant comprises a switching power converter having a power factor correction circuit and the nonlinear feedback model models nonlinearities of the power factor correction circuit.

18. The signal processing system of claim 17 wherein the nonlinear feedback model represents a squaring function.

19. The signal processing system of claim 16 wherein at least one aspect of the nonlinear plant process control signal comprises a pulse width of the nonlinear plant process control signal.

20. The signal processing system of claim 16 wherein, during operation, the nonlinear delta-sigma modulator is configured to shift noise out of a baseband of the response signal.

21. The signal processing system of claim 16 wherein the nonlinear delta-sigma modulator includes a compensation module in a forward path of the nonlinear delta-sigma modulator to compensate for nonlinearities of the nonlinear feedback model.

22. A method of controlling a nonlinear process, wherein the nonlinear process generates an output signal responsive to a control signal generated by a control system, the method comprising:
receiving an input signal;
spectrally shaping the input signal with a nonlinear delta-sigma modulator to shift noise out of a baseband of the nonlinear process output signal;
generating a nonlinear delta-sigma modulator output signal having a value representing the spectral shaping of the input signal; and
using the nonlinear delta-sigma modulator output signal to generate the control signal.

23. The method of claim 22 wherein spectrally shaping the input signal with the nonlinear delta-sigma modulator to shift noise out of the baseband of the nonlinear process output signal further comprises:
applying a nonlinear function to an immediately previously generated quantizer output signal of the nonlinear delta-sigma modulator to generate a quantizer feedback signal;
determining a difference signal representing a difference between the input signal and the quantizer feedback signal;
filtering the difference signal to generate a filtered signal; and
processing the filtered signal with a compensating function to compensate for the nonlinear function.

24. The method of claim 22 further comprising:
applying the control signal to a switch of a switching power converter to control energy transfer to and from an inductor of the switching power converter.

25. The method of claim 8 wherein applying a nonlinear function to the quantizer output signal in a feedback loop of the nonlinear delta-sigma modulator to generate a feedback signal, wherein the nonlinear function models the nonlinearities of the nonlinear process further comprises:
applying a nonlinear function to the quantizer output signal in a feedback loop of the nonlinear delta-sigma modulator to generate a feedback signal, wherein the nonlinear function models the nonlinearities of the nonlinear process of a switching power converter.

* * * * *